US012576624B2

(12) United States Patent
Matsushima

(10) Patent No.: US 12,576,624 B2
(45) Date of Patent: Mar. 17, 2026

(54) HEAT CONDUCTIVE SHEET AND METHOD FOR PRODUCING HEAT CONDUCTIVE SHEET

(71) Applicant: DEXERIALS CORPORATION, Tochigi (JP)

(72) Inventor: Masayuki Matsushima, Tochigi (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 17/098,579

(22) Filed: Nov. 16, 2020

(65) Prior Publication Data

US 2021/0060912 A1     Mar. 4, 2021

Related U.S. Application Data

(63) Continuation of application No. 15/117,580, filed as application No. PCT/JP2015/053958 on Feb. 13, 2015, now Pat. No. 10,864,709.

(30) Foreign Application Priority Data

Mar. 31, 2014    (JP) ................................. 2014-074776

(51) Int. Cl.

| | |
|---|---|
| *B32B 27/30* | (2006.01) |
| *B32B 7/06* | (2019.01) |
| *B32B 7/12* | (2006.01) |
| *B32B 27/08* | (2006.01) |
| *B32B 27/16* | (2006.01) |
| *B32B 27/20* | (2006.01) |
| *H01L 21/48* | (2006.01) |
| *H01L 23/373* | (2006.01) |
| *H01L 23/42* | (2006.01) |
| *H10W 40/25* | (2026.01) |
| *H10W 40/70* | (2026.01) |
| *H10W 70/02* | (2026.01) |

(52) U.S. Cl.
CPC ................ *B32B 27/30* (2013.01); *B32B 7/06* (2013.01); *B32B 7/12* (2013.01); *B32B 27/08* (2013.01); *B32B 27/16* (2013.01); *B32B 27/20* (2013.01); *B32B 27/302* (2013.01); *B32B 27/306* (2013.01); *B32B 27/308* (2013.01); *H10W 40/251* (2026.01); *B32B 2264/102* (2013.01); *B32B 2264/105* (2013.01); *B32B 2270/00* (2013.01); *B32B 2274/00* (2013.01); *B32B 2305/72* (2013.01); *B32B 2307/302* (2013.01); *B32B 2307/50* (2013.01); *B32B 2307/54* (2013.01); *B32B 2307/748* (2013.01); *B32B 2457/00* (2013.01); *H10W 40/255* (2026.01); *H10W 40/70* (2026.01); *H10W 70/02* (2026.01)

(58) Field of Classification Search
None
See application file for complete search history.

(56) References Cited

U.S. PATENT DOCUMENTS

| | | | | |
|---|---|---|---|---|
| 3,808,077 | A | * | 4/1974 | Rieser ............... B32B 17/10889 |
| | | | | 156/289 |
| 5,340,654 | A | | 8/1994 | Ueda et al. |
| 2010/0273012 | A1 | | 10/2010 | Moriguchi et al. |
| 2011/0070415 | A1 | | 3/2011 | Nakamura et al. |
| 2013/0122289 | A1 | | 5/2013 | Minamide et al. |
| 2013/0196164 | A1 | | 8/2013 | Minamide et al. |

FOREIGN PATENT DOCUMENTS

| | | |
|---|---|---|
| CN | 101945943 A | 1/2011 |
| CN | 102459489 A | 5/2012 |
| CN | 102959002 A | 3/2013 |
| CN | 102993451 A | 3/2013 |
| JP | 2007-123624 A | 5/2007 |
| JP | 2014-024973 A | 2/2014 |
| KR | 10-0192528 B1 | 6/1999 |
| KR | 10-2010-0099308 A | 9/2010 |
| KR | 10-1132091 B1 | 6/2012 |
| KR | 10-2013-0097141 A | 9/2013 |
| WO | 2009/081877 A1 | 7/2009 |
| WO | 2012/005270 A1 | 1/2012 |
| WO | 2012/014757 A1 | 2/2012 |

OTHER PUBLICATIONS

Merriam-Webster, definition of "mixed", date accessed: Apr. 7, 2023 <https://www.merriam-webster.com/dictionary/mixed> (Year: 2023 ).*
May 12, 2015 International Search Report issued in International Patent Application No. PCT/JP2015/053958.
Kuraray, Septontm and Hybrartm Product Brochure, May 2018 (Year: 2018).
Dec. 17, 2018 Office Action issued in Chinese Application No. 201580017182.6.
Jul. 24, 2019 Office Action issued in Chinese Application No. 201580017182.6.
Jul. 21, 2021 Office Action issued in Korean Patent Application No. 10-2016-7018340.
May 1, 19, 2022 Office Action issued in Chinese Patent Application No. 201580017182.6.

* cited by examiner

*Primary Examiner* — Cheng Yuan Huang
(74) *Attorney, Agent, or Firm* — Oliff PLC

(57) ABSTRACT

A heat conductive sheet having excellent adhesion between an acrylic resin layer and a supporting sheet is provided. The heat conductive sheet includes a heat conductive resin layer including a heat conductive acrylic resin composition; and a supporting resin layer (supporting sheet) containing a polyvinyl acetal resin and a styrene-vinyl isoprene block copolymer. Crosslinking of the supporting sheet with acrylic monomers of the acrylic heat conductive resin layer enables improvements in adhesion between the heat conductive resin layer and the supporting sheet.

19 Claims, 1 Drawing Sheet

HEAT CONDUCTIVE SHEET AND METHOD FOR PRODUCING HEAT CONDUCTIVE SHEET

This is a Divisional of application Ser. No. 15/117,580 filed Aug. 9, 2016, which is allowed and is in turn is a National Phase Application of PCT/JP2015/053958 filed Feb. 13, 2015, which claims the benefit of Japanese Patent Application No. 2014-074776 filed Mar. 31, 2014. The disclosure of each of the prior applications is hereby incorporated by reference herein in its entirety.

TECHNICAL FIELD

The present disclosure relates to an acrylic heat conductive sheet used as a heat dissipation measure for an electronic component among others and a method for producing a heat conductive sheet. This application claims priority to Japanese Patent Application No. 2014-74776 filed on Mar. 31, 2014, the entire contents of which are hereby incorporated by reference.

BACKGROUND ART

In recent years, heat conductive sheets have been used as a heat dissipation measure for electronic components (e.g. PLT. 1). In heat conductive sheets, in order to improve adhesion to an electronic component, heat conductive resin layers having excellent flexibility have been employed; however, occurrences of stretching and breakage during use of heat conductive resin layers having excellent flexibility have led to difficulties in handling. Therefore, a supporting sheet for reinforcing the heat conductive resin layer has been employed.

However, for example, in the case of using a PET film as the supporting sheet, an acrylic heat conductive resin layer would easily peel away. Priming the PET film is thus necessary, increasing the number of processes.

PRIOR ART LITERATURE

Patent Literatures

PLT 1: Japanese Unexamined Patent Application Publication No. 2007-123624

SUMMARY OF THE INVENTION

Problem to be Solved by the Invention

In view of such conventional circumstances, the present disclosure provides a heat conductive sheet having excellent adhesion between an acrylic resin layer and a supporting sheet and a method for producing the same.

Solution to Problem

As a result of earnest investigation, the present inventors have found that adhesion properties between an acrylic resin layer and a supporting sheet can be improved by using a supporting sheet containing a polyvinyl acetal resin and a styrene-vinyl isoprene block copolymer.

Thus, a heat conductive sheet according to the present disclosure comprises a heat conductive resin layer comprising a heat conductive acrylic resin composition and a supporting resin layer containing a polyvinyl acetal resin and a styrene-vinyl isoprene block copolymer.

Furthermore, a supporting sheet according to the present disclosure comprises a polyvinyl acetal resin and a styrene-vinyl isoprene block copolymer.

Still further, a method for manufacturing a heat conductive sheet according to the present disclosure comprises the steps of: forming a supporting resin layer by mixing and sheet-forming a polyvinyl acetal resin and a styrene-vinyl isoprene block copolymer; and forming a heat conductive resin layer by curing a heat conductive acrylic resin composition in a state of contact with the supporting resin layer.

Yet further, a method for manufacturing a supporting sheet according to the present disclosure comprises mixing and sheet-forming a polyvinyl acetal resin and a styrene-vinyl isoprene block copolymer.

Advantageous Effects of Invention

According to the present disclosure, crosslinking of the polyvinyl acetal resin and the styrene-vinyl isoprene block copolymer contained by the supporting resin with acrylic monomers of the acrylic resin layer enables improvements in adhesion between the acrylic resin layer and the supporting sheet.

DESCRIPTION OF EMBODIMENTS

Embodiments of the present disclosure will now be more particularly described according to the following order with reference to the accompanying drawings.
1. Heat Conductive Sheet
2. Heat Conductive Sheet Manufacturing Method
3. Examples

1. HEAT CONDUCTIVE SHEET

A heat conductive sheet according to the present disclosure has a heat conductive resin layer comprising a heat conductive acrylic resin composition and a supporting resin layer containing a polyvinyl acetal resin and a styrene-vinyl isoprene block copolymer. Preferable thickness of the heat conductive sheet is from 0.1 to 10.0 mm and preferable thickness of the supporting resin layer is 0.001 to 0.500 mm.

Figure 1:
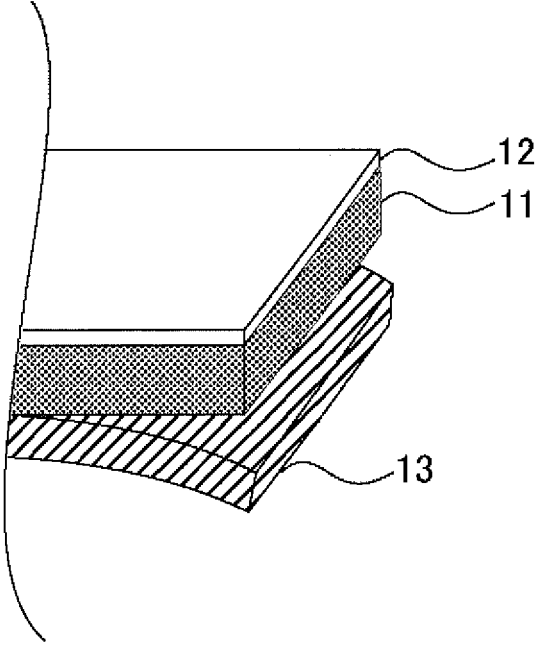
FIG. 1 is a cross sectional view illustrating one example of a heat conductive sheet according to one embodiment of the present disclosure.

FIG. 1 is a cross sectional view illustrating one example of a heat conductive sheet according to one embodiment of the present disclosure. This heat conductive sheet has a heat conductive resin layer 11 formed by curing a heat conductive acrylic resin composition and a supporting resin layer 12 for supporting the heat conductive resin layer 11. Furthermore, a release-treated film 13 which peels away at utilization time is applied to the surface of the heat conductive resin layer 11.

The heat conductive resin layer 11 is formed by curing the heat conductive acrylic resin composition. Thermal conductivity of the heat conductive resin layer 11 is preferably 0.3 W/m·K or more. Furthermore, compressibility for the heat conductive resin layer 11 is preferably from 1% to 80% when under a load of 1 kgf/cm$^2$. As compressibility increases, flexibility becomes excellent and excellent adhesion properties to heat-generating elements and heat-dissipating elements are obtainable. Furthermore, hardness for the heat conductive resin layer 11 as measured on an Asker durometer type C scale (JISK 7312) is preferably from 5 to 60.

As the heat conductive acrylic resin composition, conventionally known heat conductive acrylic resin compositions may be used. Examples of heat conductive acrylic resin compositions include those containing (A) a monofunctional (meth)acrylate, (B) a polyfunctional (meth)acrylate, (C) a photopolymerization initiator, (D) heat conductive particles, (E) a plasticizer and (F) a thiol compound.

Monofunctional (meth)acrylate including alkyl (meth) acrylate having a straight-chain or branched-chain alkyl group is preferably used. Examples of alkyl (meth)acrylate include methyl (meth)acrylate, ethyl (meth)acrylate, n-propyl (meth)acrylate, isopropyl (meth)acrylate, n-butyl (meth) acrylate, sec-butyl (meth)acrylate, tert-butyl (meth)acrylate, isobutyl (meth)acrylate, n-pentyl (meth)acrylate, isopentyl (meth)acrylate, n-hexyl (meth)acrylate, cyclohexyl acrylate, n-heptyl (meth)acrylate, n-octyl (meth)acrylate, isooctyl (meth)acrylate, 2-ethylhexyl (meth)acrylate, n-nonyl (meth) acrylate, isononyl (meth)acrylate, n-decyl (meth)acrylate, isodecyl (meth)acrylate, n-dodecyl (meth)acrylate, isomyristyl (meth)acrylate, n-tridecyl (meth)acrylate, n-tetradecyl (meth)acrylate, n-stearyl (meth)acrylate, isostearyl (meth) acrylate and n-lauryl (meth)acrylate, among others; these may be used individually or in a combination of two or more.

Examples of polyfunctional (meth)acrylates include bifunctional (meth)acrylates such as 1,3-butanediol di(meth) acrylate, 1,4-butanediol di(meth)acrylate, neopentanediol di(meth)acrylate, 1,6-hexanediol di(meth)acrylate, 1,9-nonanediol di(meth)acrylate, ethylene glycol di(meth)acrylate, polyethylene glycol di(meth)acrylate, propylene glycol di(meth)acrylate, tripropylene glycol di(meth)acrylate and polypropylene glycol di(meth)acrylate and (meth)acrylates having three or more functional groups such as trimethylolpropane tri(meth)acrylate, pentaerythritol tri(meth)acrylate, tris(acryloyloxyethyl) isocyanurate, ditrimethylolpropane tetra(meth)acrylate, pentaerythritol tetra(meth) acrylate, dipentaerythritol monohydroxy penta(meth) acrylate and dipentaerythritol hexa(meth)acrylate, among others; these may be used individually or in a combination of two or more.

Examples of the photopolymerization initiator include benzophenone, benzoin, benzoin alkyl ether, benzyl dimethyl ketal, α-hydroxy ketone and acylphosphine oxide based types, among others; these may be used individually or in a combination of two or more.

Examples of the heat conductive particles include metal hydroxides such as aluminum hydroxide and magnesium hydroxide, metals such as aluminum, copper and silver, metal oxides such as those of alumina and magnesia, nitrides such as aluminum nitride, boron nitride and silicon nitride, and carbon nanotubes, among others; these may be used individually or in a combination of two or more.

Content of the heat conductive particles in the heat conductive acrylic resin composition is preferably 100 to 2,000 pts. mass and more preferably 300 to 650 pts. mass with respect to 100 pts. mass of monofunctional (meth) acrylate. Insufficient content of the heat conductive particles results in difficulties in achieving sufficiently high thermal conductivity in the heat conductive sheet; excessive content of the heat conductive particles tends to decrease flexibility of the heat conductive sheet. Furthermore, in the case of using two heat conductive fillers having differing average particle diameters, the small-diameter filler and the large-diameter filler are preferably blended at a ratio of 15:85 to 90:10.

As the plasticizer, for example, at least one of adipic acid esters, pimelic acid esters, suberic acid esters, azelaic acid esters and sebacic acid esters may be selected for use. Such a dicarboxylic acid ester can be obtained by conventional esterification of an alcohol and a dicarboxylic acid selected from adipic acid (HOOC—$(CH_2)_4$—COOH), pimelic acid (HOOC—$(CH_2)_5$—COOH), suberic acid (HOOC—$(CH_2)_6$—COOH), azelaic acid (HOOC—$(CH_2)_7$—COOH), and sebacic acid (HOOC—$(CH_2)_8$—COOH). More particularly, as the plasticizer, it is preferable to use at least one of diisodecyl adipate, diisodecyl pimelate, diisodecyl suberate, diisodecyl azelate and diisodecyl sebacate being esterified from isodecyl alcohol and one of adipic acid, pimelic acid, suberic acid, azelaic acid.

As the thiol compound, polyfunctional thiol having two or more functional groups may be used. Usable examples of polyfunctional thiol having two or more groups include 3-functional thiol compounds such as 1,3,5-tris(3-mercapto-butyloxyethyl)-1,3,5-triazine-2,4,6(1H, 3H, 5H)-trione, 2-methyl-2-((3-mercapto-1-oxopropyl)-methyl) propane-1, 3-diylbis(3-mercaptopropionate), trimethylolpropane tri sthiopropionate, trimethylolpropane tristhioglycolate and 2,4,6-trimercapto-s-triazine, 4-functional thiol compounds such as pentaerythritol tetrakis(3-mercapto butyrate), pentaerythritol tetrakis thioglycolate, dipentaerythritol tetrakis thioglycolate, pentaerythritol tetrakis thiopropionate, 5-functional thiol compounds such as dipentaerythritol pentakis thioglycolate and 6-functional thiol compounds such as dipentaerythritol hexakis thioglycolate; these may be used individually or in a combination of two or more.

Furthermore, other components such as antioxidants, thermal degradation inhibitors, flame retardants and colorants may be blended into the heat conductive acrylic resin composition.

Examples of the antioxidants include primary antioxidants which capture radicals generated by thermal degradation and secondary antioxidants which decompose peroxides generated by thermal degradation; these may be used individually or in a combination of two or more. Examples of thermal degradation inhibitors include acrylic acid monoesters such as 1,1-bis(2-hydroxy-3,5-di-tert-pentylphenyl)methane.

Moreover, the heat conductive acrylic resin composition is not limited to the configuration described above and other heat conductive acrylic resin compositions may be used. For example, commercially available products include GNS of the TransCool series of INOAC CORPORATION and Shirokinon Series (TAICA CORPORATION) and 5580H (Sumitomo 3M Ltd.), among others.

The supporting resin layer 12 is a supporting sheet containing a polyvinyl acetal resin and a styrene-vinyl isoprene block copolymer.

The polyvinyl acetal resin is obtained by acetalization of an aldehyde with a polyvinyl alcohol. Polyvinyl alcohols are, for example, obtained by saponification of polyvinyl acetate; degree of saponification is generally 80 mol % to 99.8 mol %. Polymerization degree of the polyvinyl alcohol is generally 200 to 3,000. Examples of aldehyde include formaldehyde, acetaldehyde, n-butyraldehyde, isobutyraldehyde, n-hexyl aldehyde and n-valeraldehyde, among others; these may be used individually or in a combination of two or more. Among these, reacting acetaldehyde or butyraldehyde with the polyvinyl alcohol to obtain polyvinyl acetal or polyvinyl butyral for use is particularly preferable.

Molecular weight of the polyvinyl acetal resin is $5 \times 10^4$ to $20 \times 10^4$ and more preferably $8 \times 10^4$ to $15 \times 10^4$. An excessively low molecular weight causes exhibition of adhesiveness and might degrade dry properties of the supporting sheet, and an excessively high molecular weight might degrade flexibility of the supporting sheet.

Furthermore, glass transition temperature (Tg) of the polyvinyl acetal resin is 50 to 150° C. and more preferably 80 to 120° C. An excessively low glass transition temperature causes exhibition of adhesiveness and might degrade drying properties of the supporting sheet, and an excessively high glass transition temperature might degrade flexibility of the supporting sheet.

Furthermore, degree of acetalization of the polyvinyl acetal resin (degree of butyralization in the case of polyvinyl butyral resin) is 50 to 90 mol % and more preferably 60 to 80 mol %. An excessively low degree of acetalization might degrade compatibility with the styrene-vinyl isoprene block copolymer; an excessively high degree of acetalization might degrade thermal tolerance of the supporting sheet.

Degree of acetalization is a mole fraction expressed as a percent (mol %) obtained by dividing the amount of ethylene groups to which acetal groups are bonded by the total amount of ethylene groups in main chains. The acetalization degree can be obtained in accordance with JIS K6728 "Test Methods for Polyvinyl Butyral" by measuring the degree of acetylation (amount of acetyl groups) and the hydroxyl group content (the amount of vinyl alcohol), calculating the molar fractions based on the measurement results and subtracting the molar fractions of the acetyl groups and hydroxyl groups from 100 mol %.

Commercially available polyvinyl acetal resins include, for example, S-LEC BX-1, BX-5, KS-3 and KS-5 (SEKISUI CHEMICAL CO., LTD.), among others.

The styrene-vinyl isoprene block copolymer is a triblock copolymer comprising a styrene block and a vinyl-polyisoprene block and is a thermoplastic elastomer in which the styrene units are hard segments and the vinyl-polyisoprene units are soft segments.

Styrene content of the styrene-vinyl isoprene block copolymer is 10% to 30% and preferably 15% to 25%. Excessively low styrene content leads to insufficient hard segments which might degrade rubber elasticity; excessively high styrene content might degrade flexibility of the supporting sheet.

Furthermore, a glass transition temperature (Tg) of the styrene-vinyl isoprene block copolymer is −40 to +40° C. and preferably −20 to +20° C. An excessively low glass transition temperature causes exhibition of adhesiveness and might degrade drying properties of the supporting sheet, and an excessively high glass transition temperature might degrade flexibility of the supporting sheet.

Examples of commercially available styrene-vinyl isoprene block copolymers include HYBRAR 5125 and 5127 (KURARAY CO., LTD.), among others.

Furthermore, the polyvinyl acetal and the styrene-vinyl isoprene block copolymer are preferably blended at 9:1 to 7:3 mass ratio. An insufficient blending amount of the styrene-vinyl isoprene block copolymer leads to adhesion properties with the heat conductive resin layer being unobtainable; an excessive blending amount of the styrene-vinyl isoprene block copolymer might degrade drying properties and/or strength of the supporting sheet.

Furthermore, a cross-linking agent may be added to the supporting resin layer 12. Examples of usable cross-linking agents include isocyanate crosslinking agents, epoxy crosslinking agents and silicone-based crosslinking agents, which may be used individually or in a combination of two or more.

The surface of the supporting resin layer 12 is preferably rough. A rough surface of the supporting resin layer 12 increases contact area with the heat conductive resin, leading to an increase in vinyl group cross-linking points, thereby improving adhesion due to this anchoring effect.

As the release-treated film 13, a product obtained by coating a release agent such as silicone to PET (polyethylene terephthalate), OPP (oriented polypropylene), PMP (poly-4-methylpentene-1) or PTFE (polytetrafluoroethylene), among others.

In such a heat conductive sheet, crosslinking of the supporting resin layer containing polyvinyl acetal resin and styrene-vinyl isoprene block copolymer with acrylic monomers of the acrylic heat conductive resin layer enables improvements in adhesion between the heat conductive resin layer and the supporting sheet. Additionally, because the surface of the supporting sheet is dry, improvements in workability are enabled. Furthermore, due to having excellent thermal conductivity and flexibility, the heat conductive sheet is suitable for use in precision equipment such as hard disk devices and laser devices.

It should be noted that in the embodiment described above, a configuration was described in which the supporting resin layer was provided on one side of the heat conductive resin layer; however, configurations in which the supporting resin layers are provided on both sides of the heat conductive resin layer and configurations in which the heat conductive resin layers are provided on both sides of the supporting resin layer are possible. Furthermore, in the embodiment described above, the supporting sheet was used in a heat conductive sheet; however, the present disclosure is not limited thereto. For example, the supporting sheet may be used as a support material for an acrylic-type adhesive tape or bonding tape.

2. HEAT CONDUCTIVE SHEET MANUFACTURING METHOD

The method for manufacturing a heat conductive sheet according to the present disclosure comprises the steps of forming a supporting resin layer by mixing a polyvinyl acetal resin and a styrene-vinyl isoprene block copolymer which is then sheet-formed, and forming a heat conductive resin layer by curing a heat conductive acrylic resin composition in a state of contact with the supporting resin layer.

In the step of forming the supporting resin layer, 10 to 65 pts. mass and preferably 10 to 45 pts. mass of the styrene-vinyl isoprene block copolymer with respect to 100 pts. mass of the polyvinyl acetal resin is added and mixed to prepare a supporting resin composition. In sheet forming, for example, the supporting resin composition is uniformly applied to a release-treated film using a bar coater and dried. The polyvinyl acetal resin and the styrene-vinyl isoprene block copolymer are thermoplastic resins which therefore can be sheet-formed without a solvent by using an injection molding method, extrusion molding method or kneading method, among others.

In the step of forming the heat conductive resin layer, the heat conductive acrylic resin composition is cured in a state of contact with the supporting resin layer. Presumably, by vinyl group components of the styrene-vinyl isoprene block copolymer of the supporting resin layer and acrylic monomer components of the heat conductive acrylic resin composition being phase compatible or by curing, mutual integration occurs enabling improvements in adhesion. Usable curing methods include conventional curing methods such as by light, heat and solvent; however, it is preferable to use at least one of light and heat.

Furthermore, in the heat conductive resin layer forming step, the heat conductive acrylic resin composition may be cured in a state of being sandwiched between two of the supporting sheets and may be cured in a state of being applied to both sides of the supporting sheet.

In such a method for manufacturing a heat conductive sheet, in the step of forming the heat conductive resin layer, the heat conductive resin layer and the supporting resin layer can be strongly bonded by curing the heat conductive acrylic resin composition.

3. EXAMPLES

Examples

Examples of the present disclosure will now be described. In the following examples, supporting resin layers were formed by mixing polyvinyl acetal and styrene-vinyl isoprene block copolymer at predetermined mass ratios. Next, heat conductive resin layers were formed by curing heat conductive acrylic resin compositions on the supporting resin layers to manufacture heat conductive sheets. Subsequently, for each of the heat conductive sheets, tensile strength, T-type peel strength of the supporting resin layer and the heat conductive resin layer and tack of the surface of the supporting resin layer were measured/evaluated. It should be noted that the present invention is not limited to these examples.

Manufacturing of the heat conductive sheets, tensile strength measurement/evaluation, T-type peel strength measurement/evaluation, and tack measurement/evaluation were performed in the following manner.

Heat Conductive Sheet Manufacturing

Polyvinyl acetal (S-LEC BX-1, SEKISUI CHEMICAL CO., LTD.) and styrene-vinyl isoprene block copolymer (HYBRAR 5125, KURARAY CO., LTD.) were mixed at predetermined mass ratios to obtain supporting resin compositions. These supporting resin compositions were applied to release-treated films comprising PET using a bar coater at a thickness of 0.01 mm to form supporting resin layers.

Furthermore, 100 pts. mass 2-ethylhexyl acrylate as a monofunctional acrylate, 47 pts. mass castor-oil derivative fatty acid ester as a plasticizer, 1.5 pts. mass hydroxy pivalic acid neopentyl glycol diacrylate (KAYARAD FM-400, Nippon Kayaku Co., Ltd.) as a polyfunctional acrylate, 1.4 pts. mass photopolymerization initiator (IRGACURE 819, BASF) and 400 pts. mass aluminum hydroxide powder (80 μm average particle diameter) along with 400 pts. mass aluminum hydroxide powder (8 μm average particle diameter) as heat conducting fillers were mixed to prepare heat conductive acrylic resin compositions.

The heat conductive acrylic resin composition was applied onto the supporting resin layers before irradiating ultraviolet light at an intensity of 1 mW/cm$^2$ for five minutes simultaneously to both sides of the heat conductive acrylic resin composition surface and the supporting resin layer surface to manufacture heat conductive sheets comprising 0.01 mm thick supporting resin layers and 1.0 mm thick heat conductive resin layers.

Tensile Strength Measurement/Evaluation

Samples of the heat conductive sheet comprising the heat conductive resin layer 11 and the supporting resin layer 12 were manufactured by using a hand press and a punch die (dumbbell-shaped No. 3) having a narrow section which was 20 mm long and 5 mm wide. A tensile testing machine (RTG-1225, ORIENTEC CORPORATION) pulling at a speed of 500 mm/min was used to measure strength (tensile load divided by cross-sectional area of the samples) at the time of severance (breakage). A tensile strength of 0.4 Pa or more was evaluated as "good" (hereinafter referred to as "G") and a tensile strength of less than 0.4 MPa was evaluated as "fail" (hereinafter referred to as "F").

T-Type Peel Strength Measurement/Evaluation

Figure 2:
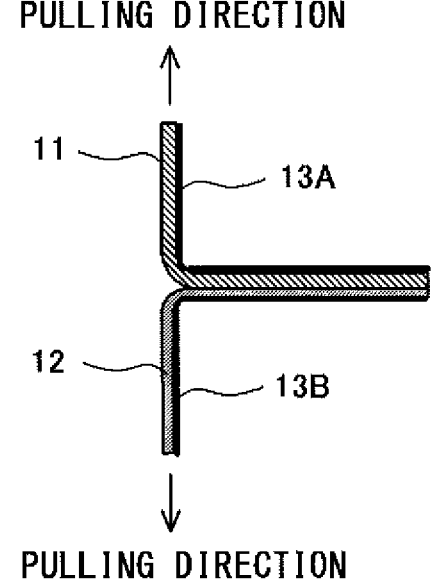
FIG. 2 is an explanatory diagram of a T-type peel strength measurement method of a heat conductive resin layer and a supporting resin layer.

As shown in FIG. 2, a tensile testing machine (RTG-1225, ORIENTEC CORPORATION) was used in a T-peel test to measure delamination strength of the heat conductive resin layer 11 and the supporting resin layer 12 in a state in which a release-treated film 13A comprising PET was pasted to the heat conductive resin layer 11 and a release-treated film 13B comprising PET was pasted to the supporting resin layer 12. Peel speed in this case was 300 mm/min and sample width was 15 mm. Delamination strengths of 0.2 N/20 mm or more were evaluated as G, less than 0.2 but more than 0.15 N/20 mm were evaluated as intermediate (hereinafter referred to as "I"), and less than 0.15 N/20 mm were evaluated as F.

Surface Tack Measurement/Evaluation

A TAC-II tack tester manufactured by RHESCA CO., LTD. was used as a tack testing device to measure probe tack when pressing and peeling away; to the supporting resin layer, an unheated aluminum cylinder with a 10 mm diameter approached at 30 mm/min, was pressed for 5 seconds with a 196 g load and was peeled away at a speed of 120 mm/min over a distance of 5 mm. Supporting resin layer tack was evaluated as G for less than 10 kN/m$^2$, I for 10 kN/m$^2$ or more but less than 15 kN/m$^2$, and F for 15 kN/m$^2$ or more.

Comparative Example 1

Other than that polyvinyl acetal resin and styrene-vinyl isoprene block copolymer were mixed at a mass ratio of 10:0 to form the supporting resin layer, a heat conductive sheet was manufactured as described above. As represented in Table 1, Comparative Example 1 had a tensile strength evaluation of G, a T-type peel strength evaluation of F, and a surface tack evaluation of G.

Example 1

Other than that polyvinyl acetal resin and styrene-vinyl isoprene block copolymer were mixed at a mass ratio of 9:1 to form the supporting resin layer, a heat conductive sheet was manufactured as described above. As represented in Table 1, Example 1 had a tensile strength evaluation of G, a T-type peel strength evaluation of I, and a surface tack evaluation of G.

Example 2

Other than that polyvinyl acetal resin and styrene-vinyl isoprene block copolymer were mixed at a mass ratio of 8.5:1.5 to form the supporting resin layer, a heat conductive sheet was manufactured as described above. As represented in Table 1, Example 2 had a tensile strength evaluation of G, a T-type peel strength evaluation of G, and a surface tack evaluation of G.

Example 3

Other than that polyvinyl acetal resin and styrene-vinyl isoprene block copolymer were mixed at a mass ratio of 8:2 to form the supporting resin layer, a heat conductive sheet was manufactured as described above. As represented in Table 1, Example 3 had a tensile strength evaluation of G, a T-type peel strength evaluation of G, and a surface tack evaluation of G.

Example 4

Other than that polyvinyl acetal resin and styrene-vinyl isoprene block copolymer were mixed at a mass ratio of 7:3 to form the supporting resin layer, a heat conductive sheet was manufactured as described above. As represented in Table 1, Example 4 had a tensile strength evaluation of G, a T-type peel strength evaluation of G, and a surface tack evaluation of I.

Comparative Example 2

Other than that polyvinyl acetal resin and styrene-vinyl isoprene block copolymer were mixed at a mass ratio of 0:10

KURARAY CO., LTD.) were mixed at a mass ratio of 3:7 to form the supporting resin layer, a heat conductive sheet was manufactured as described above. As represented in Table 1, Comparative Example 5 had a tensile strength evaluation of F, a T-type peel strength evaluation of F, and a surface tack evaluation of F.

Comparative Example 6

Other than that polyvinyl acetal resin and styrene-ethylene/butylene-styrene block copolymer (SEPTON V9827, KURARAY CO., LTD.) were mixed at a mass ratio of 0:10 to form the supporting resin layer, a heat conductive sheet was manufactured as described above. As represented in Table 1, Comparative Example 6 had a tensile strength evaluation of F, a T-type peel strength evaluation of F, and a surface tack evaluation of F.

TABLE 1

| | Supporting Resin Layer | Tensile Strength Evaluation | T-Type Peel Strength Evaluation | Surface Tack Evaluation |
|---|---|---|---|---|
| Comp. 1 | [BX-1]:[HYBRAR 5125] = 10:0 | G | F | G |
| Ex. 1 | [BX-1]:HYBRAR 5125] = 9:1 | G | I | G |
| Ex. 2 | [BX-1]:HYBRAR 5125] = 8.5:1.5 | G | G | G |
| Ex. 3 | [BX-1]:HYBRAR 5125] = 8:2 | G | G | G |
| Ex. 4 | [BX-1]:HYBRAR 5125] = 7:3 | G | G | I |
| Comp. 2 | [BX-1]:HYBRAR 5125] = 0:10 | F | G | F |
| Comp. 3 | [BX-1]:[SEPTON V9827] = 9:1 | G | F | G |
| Comp. 4 | [BX-1]:[SEPTON V9827] = 7:3 | G | F | G |
| Comp. 5 | [BX-1]:[SEPTON V9827] = 3:7 | F | F | F |
| Comp. 6 | [BX-1]:[SEPTON V9827] = 0:10 | F | F | F | to form the supporting resin layer, a heat conductive sheet was manufactured as described above. As represented in Table 1, Comparative Example 2 had a tensile strength evaluation of F, a T-type peel strength evaluation of G, and a surface tack evaluation of F.

Comparative Example 3

Other than that polyvinyl acetal resin and styrene-ethylene/butylene-styrene block copolymer (SEPTON V9827, KURARAY CO., LTD.) were mixed at a mass ratio of 9:1 to form the supporting resin layer, a heat conductive sheet was manufactured as described above. As represented in Table 1, Comparative Example 3 had a tensile strength evaluation of G, a T-type peel strength evaluation of F, and a surface tack evaluation of G.

Comparative Example 4

Other than that polyvinyl acetal resin and styrene-ethylene/butylene-styrene block copolymer (SEPTON V9827, KURARAY CO., LTD.) were mixed at a mass ratio of 7:3 to form the supporting resin layer, a heat conductive sheet was manufactured as described above. As represented in Table 1, Comparative Example 4 had a tensile strength evaluation of G, a T-type peel strength evaluation of F, and a surface tack evaluation of G.

Comparative Example 5

Other than that polyvinyl acetal resin and styrene-ethylene/butylene-styrene block copolymer (SEPTON V9827, As in Comparative Examples 3 to 6, in the case of adding a styrene-ethylene/butylene-styrene block copolymer having unsaturated bonds, delamination strength between the heat conductive resin layer and the supporting resin layer was low and excellent adhesion was unobtainable. Furthermore, as in Comparative Example 1, in the case of a supporting resin layer comprising only polyvinyl acetal, delamination strength between the heat conductive resin layer and the supporting resin layer was low and excellent adhesion was unobtainable. Moreover, as in Comparative Example 2, in the case of a supporting resin layer consisting only of styrene-vinyl isoprene block copolymer, tensile strength was reduced in the heat conductive sheet as well as tack being exhibited by the supporting resin layer thus degrading dry properties.

In contrast, as in Examples 1 to 4, in the case of mixing polyvinyl acetal and styrene-vinyl isoprene block copolymer at mass ratios of 9:1 to 7:3 to form the supporting resin layer, delamination strength between the heat conductive resin layer and the supporting resin layer was high and excellent adhesion was obtainable. Furthermore, tensile strength of the heat conductive sheet was high as well as dry properties of the supporting resin layer being maintainable.

REFERENCE SIGNS LIST

11 heat conductive resin layer, 12 supporting resin layer, 13 release-treated film

The invention claimed is:

1. A supporting resin layer comprising:

a polyvinyl acetal resin; and a styrene-vinyl isoprene block copolymer, wherein:

the polyvinyl acetal resin and the styrene-vinyl iso-prene block copolymer are mixed into a same single composition at a mass ratio from 9:1 to 7:3 and formed from the mixed same single composition into a single-layer sheet, a degree of acetalization of the polyvinyl acetal resin is 50 to 90 mol %, the polyvinyl acetal resin has a molecular weight from $5 \times 10^4$ to $20 \times 10^4$, the supporting resin layer has a surface tack of less than 10 kN/m², the polyvinyl acetal resin has a glass transition tem-perature from 50 to 150° C.

2. The supporting resin layer according to claim 1, wherein the polyvinyl acetal resin is polyvinyl acetal or polyvinyl butyral.

3. The supporting resin layer according to claim 1, wherein the styrene-vinyl isoprene block copolymer has a glass transition temperature from –40 to +40° C.

4. The supporting resin layer according to claim 1, wherein the styrene-vinyl isoprene block copolymer has a styrene content from 10% to 30%.

5. The supporting resin layer according to claim 1, wherein the polyvinyl acetal resin and the styrene-vinyl isoprene block copolymer are mixed into the same single composition at a mass ratio from 8.5:1.5 to 8:2.

6. The supporting resin layer according to claim 1, wherein the supporting resin layer has a rough surface in contact with an acrylic resin layer.

7. The supporting resin layer according to claim 1, wherein the supporting resin layer has a thickness of 0.001 mm or more and 0.500 mm or less.

8. A method for manufacturing a supporting sheet com-prising:

mixing a polyvinyl acetal resin and a styrene-vinyl iso-prene block copolymer into a same single composition, and forming from the mixed same single composition a single-layer sheet, wherein:

the polyvinyl acetal resin and the styrene-vinyl iso-prene block copolymer are blended at a mass ratio from 9:1 to 7:3, a degree of acetalization of the polyvinyl acetal resin is 50 to 90 mol %, the polyvinyl acetal resin has a molecular weight from $5 \times 10^4$ to $20 \times 10^4$, the supporting sheet has a surface tack of less than 15 kN/m², and the polyvinyl acetal resin has a glass transition tem-perature from 50 to 150° C.

9. The method for manufacturing a supporting sheet according to claim 8, wherein the polyvinyl acetal resin is polyvinyl acetal or polyvinyl butyral.

10. The method for manufacturing a supporting sheet according to claim 8, wherein the styrene-vinyl isoprene block copolymer has a glass transition temperature from –40 to +40° C.

11. The method for manufacturing a supporting sheet according to claim 8, wherein the styrene-vinyl isoprene block copolymer has a styrene content from 10% to 30%.

12. The method for manufacturing a supporting sheet according to claim 8, wherein the polyvinyl acetal resin and the styrene-vinyl isoprene block copolymer are mixed into the same single composition at a mass ratio from 8.5:1.5 to 8:2.

13. A resin sheet comprising:

a supporting resin layer containing a polyvinyl acetal resin and a styrene-vinyl isoprene block copolymer; and an acrylic resin layer formed on the supporting resin layer, wherein:

the polyvinyl acetal resin and the styrene-vinyl iso-prene block copolymer are mixed into a same single composition at a mass ratio from 9:1 to 7:3 and formed into a single-layer sheet, a degree of acetalization of the polyvinyl acetal resin is 50 to 90 mol %, the polyvinyl acetal resin has a molecular weight from $5 \times 10^4$ to $20 \times 10^4$, the supporting resin layer has a surface tack of less than 10 kN/m², and the polyvinyl acetal resin has a glass transition tem-perature from 50 to 150° C.

14. The resin sheet according to claim 13, wherein the polyvinyl acetal resin has a molecular weight from $8 \times 10^4$ to $15 \times 10^4$.

15. The resin sheet according to claim 13, wherein the polyvinyl acetal resin has a glass transition temperature from 80 to 120° C.

16. The resin sheet according to claim 13, wherein the degree of acetalization of the polyvinyl acetal resin is 60 to 80 mol %.

17. The resin sheet according to claim 13, wherein the supporting resin layer has a thickness of 0.001 mm or more and 0.500 mm or less.

18. The resin sheet according to claim 13, wherein the resin sheet has a thickness of 0.1 mm or more and 10.0 mm or less.

19. The resin sheet according to claim 13, wherein the acrylic resin layer overlays with the supporting resin layer along a thickness direction of the resin sheet, and at least a portion of an edge of the acrylic resin layer is in contact with at least a portion of an edge of the supporting resin layer.

* * * * *